US010504833B2

(12) United States Patent
Zheng et al.

(10) Patent No.: US 10,504,833 B2
(45) Date of Patent: *Dec. 10, 2019

(54) INTERCONNECTION STRUCTURE AND MANUFACTURING METHOD THEREOF

(71) Applicant: TAIWAN SEMICONDUCTOR MANUFACTURING CO., LTD., Hsinchu (TW)

(72) Inventors: Zhi-Sheng Zheng, New Taipei (TW); Chih-Lin Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,538

(22) Filed: Feb. 9, 2018

(65) Prior Publication Data

US 2018/0174962 A1 Jun. 21, 2018

Related U.S. Application Data

(63) Continuation of application No. 15/379,461, filed on Dec. 14, 2016, now Pat. No. 9,911,691, which is a continuation of application No. 14/850,848, filed on Sep. 10, 2015, now Pat. No. 9,780,025.

(60) Provisional application No. 62/098,184, filed on Dec. 30, 2014.

(51) Int. Cl.
*H01L 23/48* (2006.01)
*H01L 23/522* (2006.01)
*H01L 21/768* (2006.01)
*H01L 23/532* (2006.01)
*H01L 23/528* (2006.01)

(52) U.S. Cl.
CPC .... *H01L 23/5226* (2013.01); *H01L 21/76802* (2013.01); *H01L 21/76834* (2013.01); *H01L 21/76883* (2013.01); *H01L 23/5283* (2013.01); *H01L 23/5329* (2013.01); *H01L 21/76885* (2013.01); *H01L 2924/0002* (2013.01)

(58) Field of Classification Search
CPC ............. H01L 23/5226; H01L 23/5283; H01L 23/5329; H01L 21/76802; H01L 21/76834; H01L 21/76883; H01L 21/76885
USPC ........................................................ 257/774
See application file for complete search history.

(56) References Cited

U.S. PATENT DOCUMENTS

| 6,147,005 A | 11/2000 | Tu et al. |
| 7,132,326 B2 | 11/2006 | Lee et al. |
| 7,224,068 B2 | 5/2007 | Tseng et al. |

(Continued)

FOREIGN PATENT DOCUMENTS

| CN | 1681104 A | 10/2005 |
| KR | 10-2005-0059853 A | 6/2005 |
| TW | 200534458 S | 10/2005 |

*Primary Examiner* — Tu-Tu V Ho
(74) *Attorney, Agent, or Firm* — Maschoff Brennan

(57) ABSTRACT

An interconnection structure includes a first dielectric layer, a first conductor, an etch stop layer, and a second dielectric layer. The first conductor is partially in the first dielectric layer and having a portion protruding from the first dielectric layer. The etch stop layer is on the first dielectric layer and covering the protruding portion of the first conductor. The second dielectric layer is on the etch stop layer. A bottom surface of the second dielectric layer has a portion in a position lower than a top of the first conductor.

20 Claims, 7 Drawing Sheets

(56) References Cited

U.S. PATENT DOCUMENTS

| | | |
|---|---|---|
| 9,780,025 B2 * | 10/2017 | Zheng ................. H01L 23/5226 |
| 2005/0130367 A1 | 6/2005 | Lee et al. |
| 2014/0264926 A1 | 9/2014 | Wu et al. |
| 2014/0312508 A1 | 10/2014 | Boyanov et al. |
| 2016/0020168 A1 * | 1/2016 | Kao ...................... H01L 23/528 |
| | | 257/774 |

* cited by examiner

INTERCONNECTION STRUCTURE AND MANUFACTURING METHOD THEREOF

PRIORITY CLAIM AND CROSS-REFERENCE

This application is a continuation of U.S. patent application Ser. No. 15/379,461, filed Dec. 14, 2016, which is a continuation of U.S. patent application Ser. No. 14/850,848, filed Sep. 10, 2015, now U.S. Pat. No. 9,780,025, issued Oct. 3, 2017, which claims priority to U.S. Provisional Application Ser. No. 62/098,184, filed Dec. 30, 2014, all of which are herein incorporated by reference in their entireties.

BACKGROUND

The word "interconnection" in very large-scale integrated circuits (VLSIs) means a metal line which connects the various electronic devices. The interconnecting metal lines are separated from the substrate by insulating layers, except on the contact area. Since the creation of the integrated circuit (IC) in 1960, aluminum (Al) or its alloy has become the primary material for interconnecting metal lines, and silicon dioxide has become the primary material for insulating layers.

Copper-based chips are semiconductor integrated circuits, usually microprocessors, which use copper for interconnections. Since copper is a better conductor than aluminum, chips using this technology can have smaller metal components, and use less energy to pass electricity through them. Together, these effects lead to higher-performance processors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
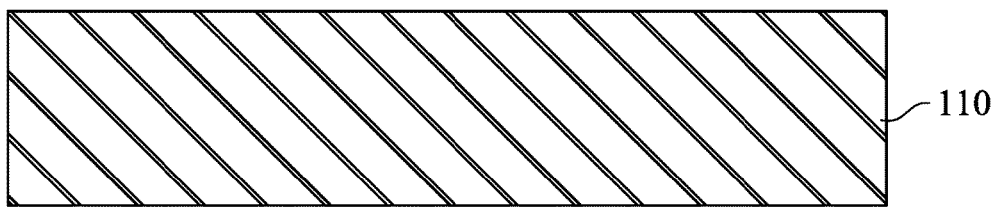
FIGS. 1-13 are cross-sectional views of an interconnection structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. A first dielectric layer 110 is formed on a substrate. The first dielectric layer 110 is an interlayer dielectric (ILD) layer. The first dielectric layer 110 is made of a dielectric material, such as silicon oxide, silicon nitride, silicon oxynitride, or combinations thereof. In some embodiments, the first dielectric layer 110 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. Another approach to reduce the dielectric constant of a dielectric material is by introducing an air gap or pores. Since the dielectric constant of air is 1, the dielectric constant of a dielectric film can be reduced by increasing the porosity of the dielectric film. In some embodiments, the low-κ dielectric material is, for example, porous silicon oxide (i.e. the xerogel or the aerogel), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The first dielectric layer 110 is formed by, for example, chemical vapor deposition (CVD), spin coating, or combinations thereof. The first dielectric layer 110 has a thickness in a range from about 400 Å to about 600 Å.

Figure 2:
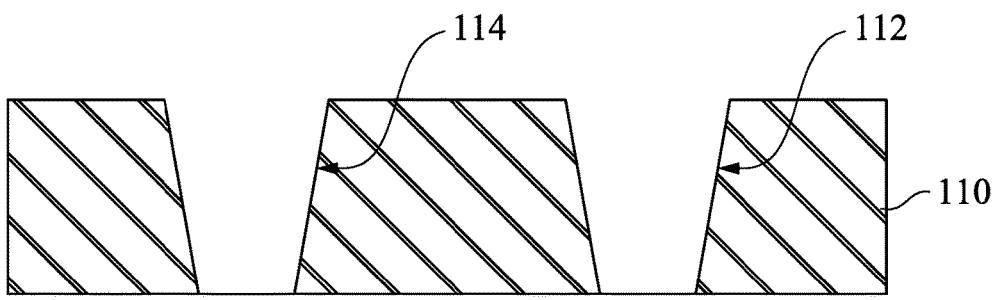

Reference is made to FIG. 2. At least one first hole 112 and at least one second hole 114 are formed in the first dielectric layer 110. The first and second holes 112 and 114 are formed by a photolithography and etching process. The photolithography and etching process includes photoresist application, exposure, developing, etching, and photoresist removal. A photoresist is applied onto the first dielectric layer 110 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

Portions of the first dielectric layer 110 which are not protected by the remaining photoresist are etched to form the first and second holes 112 and 114. The etching of the first dielectric layer 110 may be dry etching, such as reactive ion etching (RIE), plasma enhanced (PE) etching, or inductively coupled plasma (ICP) etching. In some embodiments, when the first dielectric layer 110 is made of silicon oxide, fluorine-based RIE can be used to form the first and second holes 112 and 114. The gas etchant used to dry etch the first dielectric layer 110 is, for example, $CF_4/O_2$, $ClF_3$, $CCl_3F_5$, $SF_4/O_2$, or combinations thereof.

After the first and second holes 112 and 114 are formed, the photoresist is removed from the first dielectric layer 110 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the first dielectric layer 110.

Figure 3:
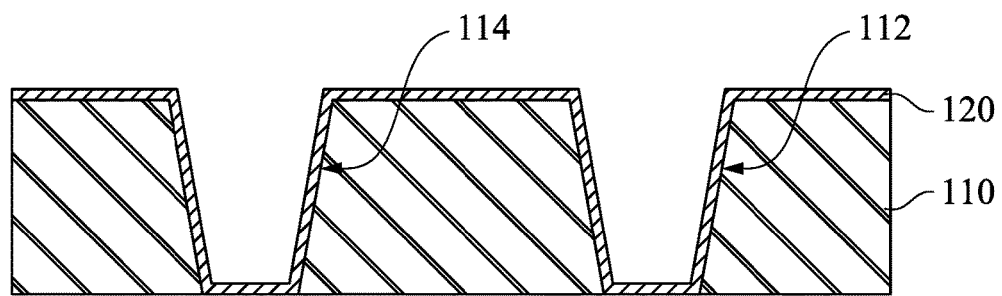

Reference is made to FIG. 3. A first barrier layer 120 is formed on sidewalls and bottom surfaces of the first and second holes 112 and 114. In FIG. 3, the first barrier layer 120 is further formed on a top surface of the first dielectric layer 110. The first barrier layer 120 is made of a material which can adhere conductors in the first and second holes 112 and 114 to the first dielectric layer 110 and can stop diffusion of the conductors into the first dielectric layer 110. In some embodiments, when the conductors in the first and second holes 112 and 114 are made of copper (Cu), the first barrier layer 120 is made of, for example, tantalum nitride (TaN), tantalum (Ta)/TaN, Ta, other transition metal based materials, or combinations thereof. In some other embodiments, when the conductors in the first and second holes 112 and 114 are made of aluminum, the first barrier layer 120 is made of, for example, titanium nitride (TiN), titanium (Ti)/TiN, Ti, other transition metal based materials, or combinations thereof. The first barrier layer 120 is formed by, for example, physical vapor deposition (PVD), ionized physical vapor deposition (IPVD), atomic layer deposition (ALD), chemical vapor deposition (CVD), or combinations thereof.

Figure 4:
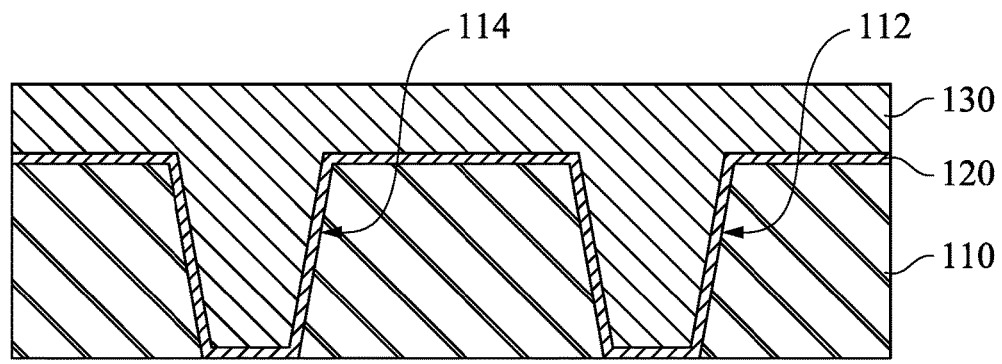

Reference is made to FIG. 4. A first electrically conductive material 130 overfills the first and second holes 112 and 114. The first electrically conductive material 130 is made of metal, such as copper (Cu), aluminum (Al), tungsten (W), nickel (Ni), cobalt (Co), titanium (Ti), platinum (Pt), tantalum (Ta), or combinations thereof. The first electrically conductive material 130 is formed by, for example, electrochemical deposition, physical vapor deposition (PVD), chemical vapor deposition (CVD), or combinations thereof.

Figure 5:
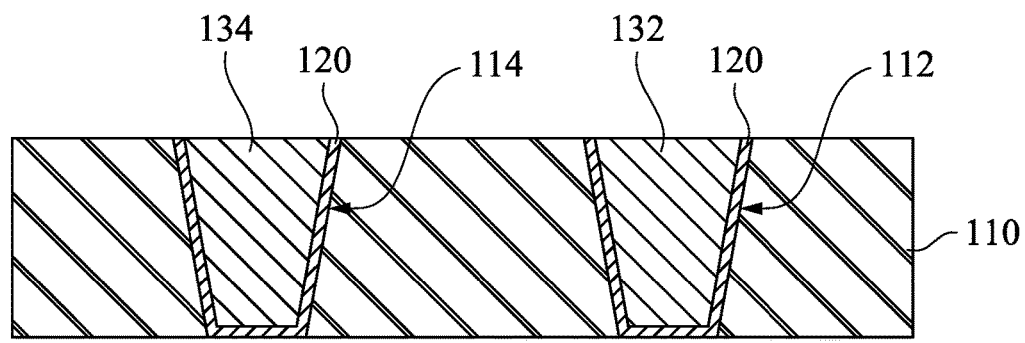

Reference is made to FIG. 5. The excess first electrically conductive material 130 and first barrier layer 120 outside of the first and second holes 112 and 114 are removed through a removal process. In some embodiments, the first electrically conductive material 130 and the first barrier layer 120 over burden are removed by a chemical mechanical polishing (CMP) process. In some embodiments, when the first electrically conductive material 130 is made of copper (Cu), the CMP slurry is made of, for example, a mixture of suspended abrasive particles, an oxidizer, and a corrosion inhibitor, and the CMP slurry is acidic. A two-step CMP process may be used to remove the excess first electrically conductive material 130 and first barrier layer 120. In the first step, the abrasive will remove the bulk first electrically conductive material 130 without disturbing the first barrier layer 120. In the second step, the residual first electrically conductive material 130 and the first barrier layer 120 will be removed using silica abrasive. After the CMP process, a first bottom conductor 132 is formed in the first hole 112, and a second bottom conductor 134 is formed in the second hole 114.

Figure 6:
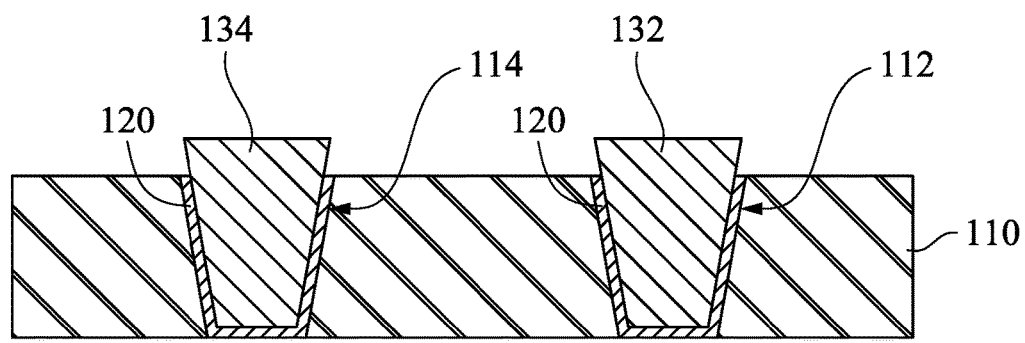

Reference is made to FIG. 6. The first dielectric layer 110 is etched back. The first and second bottom conductors 132 and 134 have higher etch resistance to the etching back than that of the first dielectric layer 110. Therefore, the first bottom conductor 132 has a portion protruding from the top surface of the first dielectric layer 110, and the second bottom conductor 134 has a portion protruding from the top surface of the first dielectric layer 110 as well. The etching back of the first dielectric layer 110 may be dry etching, such as reactive ion etching (RIE), plasma enhanced (PE) etching, or inductively coupled plasma (ICP) etching. In some embodiments, fluorine-based RIE can be used to etch back the first dielectric layer 110. The gas etchant used to etch back the first dielectric layer 110 is, for example, $CF_4/O_2$, $ClF_3$, $CCl_3F_5$, $SF_4/O_2$, or combinations thereof. In some embodiments, the etching back of the first dielectric layer 110 has an etching depth in a range from about 25 Å to about 275 Å.

Figure 7:
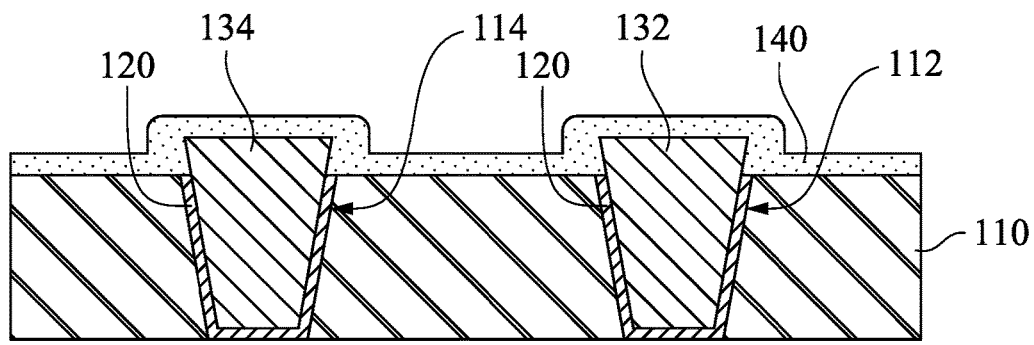

Reference is made to FIG. 7. An etch stop layer 140 is formed on the first dielectric layer 110 and the protruding portions of the first and second bottom conductors 132 and 134.

Figure 8:
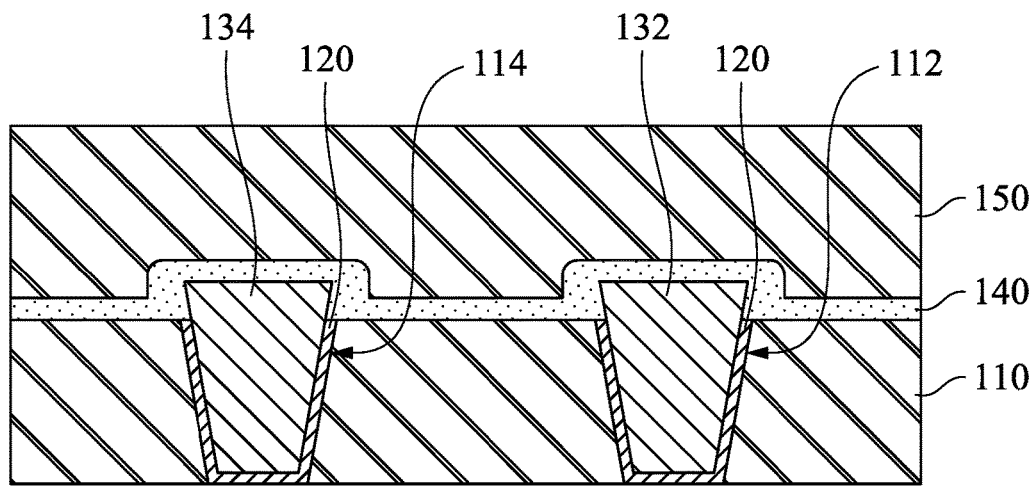

Reference is made to FIG. 8. A second dielectric layer 150 is formed on the etch stop layer 140. The second dielectric layer 150 is an interlayer dielectric (ILD) layer as well. The second dielectric layer 150 is made of a dielectric material, such as silicon oxide, silicon nitride, silicon oxynitride, or combinations thereof. In some embodiments, the second dielectric layer 150 is made of a low-κ dielectric material, such as hydrogenated carbon-doped silicon oxide (SiCOH), fluorosilicate glass (FSG), porous silicon oxide (i.e. the xerogel or the aerogel), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The second dielectric layer 150 is formed by, for example, chemical vapor deposition (CVD), spin coating, or combinations thereof. The second dielectric layer 150 has a thickness in a range from about 400 Å to about 600 Å.

Figure 9:
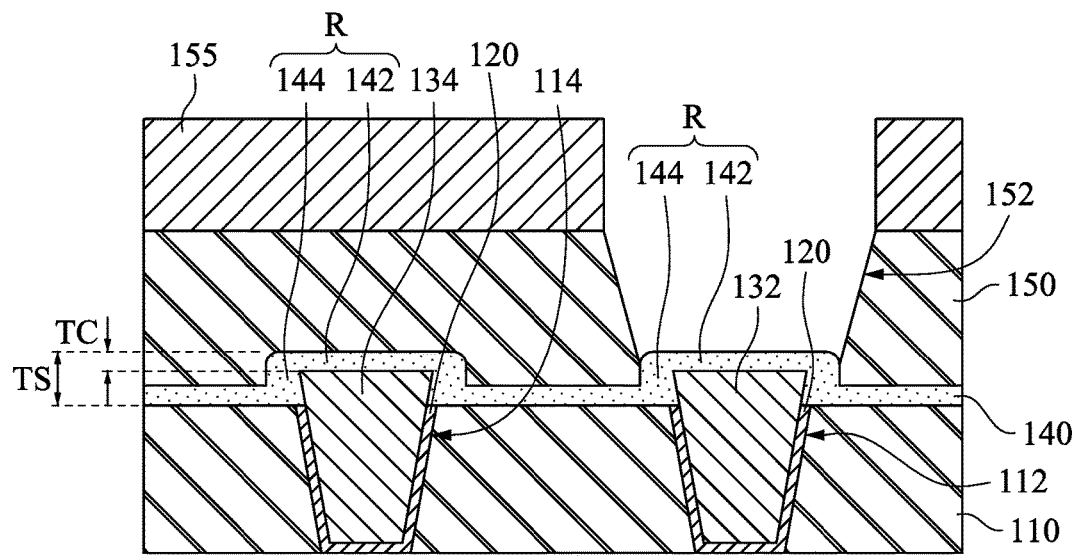

Reference is made to FIG. 9. A third hole 152 is formed in the second dielectric layer 150. The third hole 152 is formed by a photolithography and etching process. The photolithography and etching process includes photoresist application, exposure, developing, and etching. A photoresist is applied onto the second dielectric layer 150 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist 155 is then hard-baked to solidify the remaining photoresist 155.

At least one portion of the second dielectric layer 150 which is not protected by the remaining photoresist 155 is etched to form the third hole 152. The etching of the second dielectric layer 150 may be dry etching, such as reactive ion etching (RIE), plasma enhanced (PE) etching, or inductively coupled plasma (ICP) etching. In some embodiments, when the second dielectric layer 150 is made of silicon oxide, fluorine-based RIE can be used to form the third hole 152, and the gas etchant used to dry etch the second dielectric layer 150 is, for example, $CF_4/O_2$, $ClF_3$, $CCl_3F_5$, $SF_4/O_2$, or combinations thereof.

The etch stop layer 140 and the second dielectric layer 150 have different etch resistance properties. In some embodiments, the etch stop layer 140 is made of a material which has higher etch resistance to the etchant used to etch the third hole 152 than that of the second dielectric layer 150. Therefore, the etching of the second dielectric layer 150 is stopped by the etch stop layer 140 without overetching the first dielectric layer 110. In some embodiments, when the second dielectric layer 150 is made of silicon oxide, the etch stop layer 140 is made of a carbon-rich material, such as silicon carbon nitride (SiCN). The etch stop layer 140 is formed by, for example, plasma-enhanced chemical vapor deposition (PECVD).

The etch stop layer 140 and the first dielectric layer 110 have different etch resistance properties as well. In some embodiments, the etch stop layer 140 has higher etch resistance to the etchant used to etch the third hole 152 than that of the first dielectric layer 110. Therefore, even if the etching of the second dielectric layer 150 overetches the etch stop layer 140, the overetching of the etch stop layer 140 is slighter than the overetching of the first dielectric layer 110 in absence of the etch stop layer 140. In some embodiments, when the first dielectric layer 110 is made of silicon oxide, the etch stop layer 140 is made of a carbon-rich material, such as silicon carbon nitride (SiCN).

The etch stop layer 140 has a thickness in a range from about 50 Å to about 300 Å. The etch stop layer 140 has raised portions R respectively covering the protruding portions of the first and second bottom conductors 132 and 134. At least one of the raised portions R has a cap part 142 and at least one spacer part 144. The cap part 142 covers a top surface of the protruding portion of at least one of the first and second bottom conductors 132 and 134. The spacer part 144 is disposed on at least one sidewall of the protruding portion of at least one of the first and second bottom conductors 132 and 134. The spacer part 144 is thicker than the cap part 142. In some embodiments, the cap part 142 has a thickness TC in a range from about 50 Å to about 500 Å, and the spacer part 144 has a thickness TS in a range from about 150 Å to about 700 Å.

Figure 10:
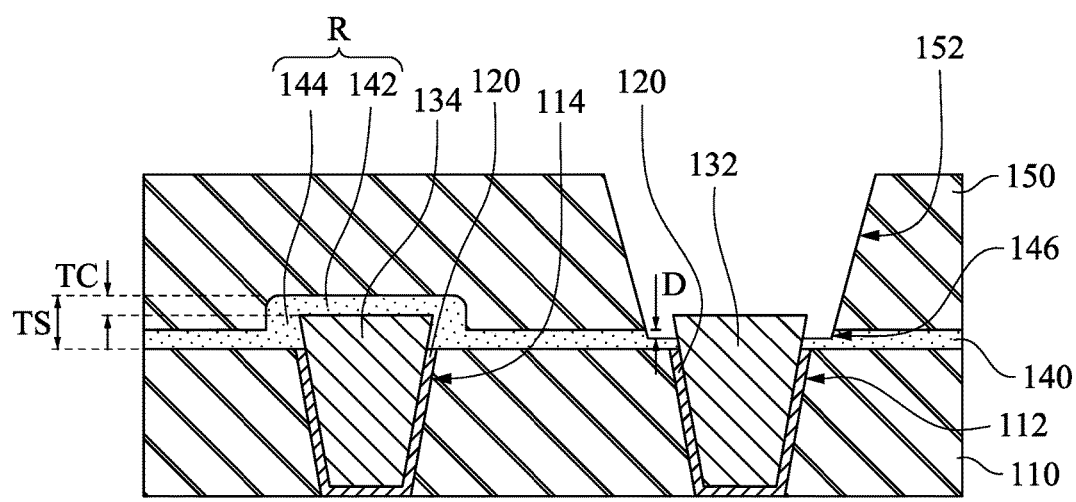

Reference is made to FIG. 10. At least one portion of the etch stop layer 140 which is exposed by the third hole 152 is etched to form an opening 146. The opening 146 is in communication with the third hole 152, and the protruding portion of the first bottom conductor 132 is at least partially exposed by the opening 146. The etching of the etch stop layer 140 may be dry etching, such as reactive ion etching (RIE), plasma enhanced (PE) etching, or inductively coupled plasma (ICP) etching. In some embodiments, when the etch stop layer 140 is made of silicon carbon nitride (SiCN), fluorine-based RIE can be used to form the opening 146, and the gas etchant of the RIE is, for example, $C_2F_6$, $CF_4/O_2$, $CF_4/H_2$, $C_3F_8$, or combinations thereof.

Since the spacer part 144 is thicker than the cap part 142, the etching of the etch stop layer 140 can remove the cap part 142 to expose the first bottom conductor 132 while leave at least a portion of the spacer part 144 on the first dielectric layer 110. That is, the etching the opening 146 is stopped before reaching the first dielectric layer 110, and thus the first dielectric layer 110 is not exposed by the opening 146. In some embodiments, the opening 146 has a depth D in a range from about 0 Å to about 100 Å.

After the opening 146 is formed, the photoresist 155 is removed from the second dielectric layer 150 by, for example, plasma ashing, stripping, or combinations thereof. Plasma ashing uses a plasma source to generate a monatomic reactive species, such as oxygen or fluorine. The reactive species combines with the photoresist 155 to form ash which is removed with a vacuum pump. Stripping uses a photoresist stripper, such as acetone or a phenol solvent, to remove the photoresist 155 from the second dielectric layer 150.

Figure 11:
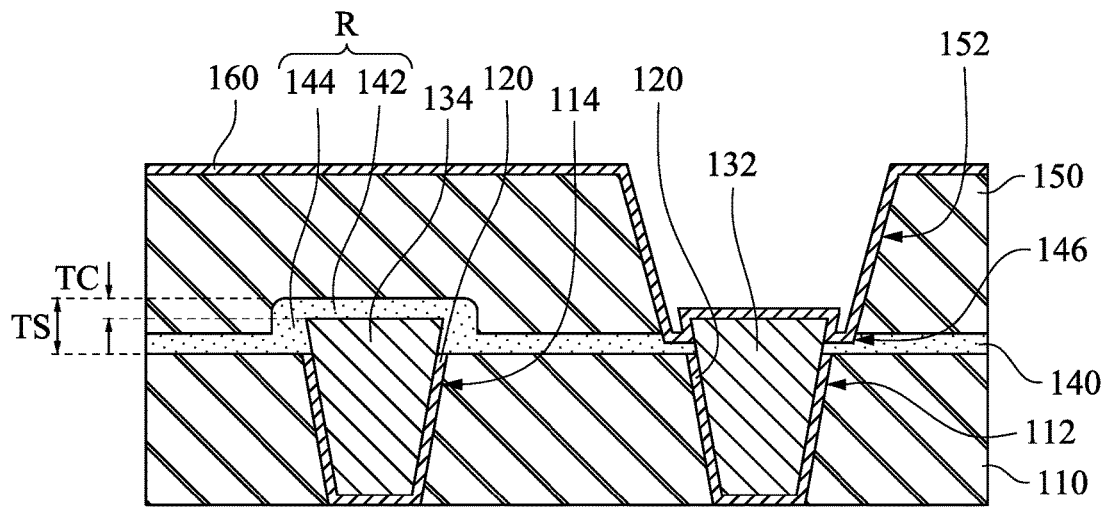

Reference is made to FIG. 11. A second barrier layer 160 is formed on sidewalls of the third hole 152 and sidewalls and a bottom surface of the opening 146. In FIG. 11, the second barrier layer 160 is further formed on a top surface of the second dielectric layer 150. Since the opening 146 has a low aspect ratio, the second barrier layer 160 can be formed in the opening 146 with at least acceptable step coverage. The second barrier layer 160 is made of a material which can adhere a conductor in the third hole 152 and the opening 146 to the second dielectric layer 150 and the etch stop layer 140 and stop diffusion of the conductor into the second dielectric layer 150 and the etch stop layer 140. In some embodiments, when the conductor in the third hole 152 and the opening 146 is made of copper (Cu), the second barrier layer 160 is made of, for example, tantalum nitride (TaN), tantalum (Ta)/TaN, Ta, other transition metal based materials, or combinations thereof. In some other embodiments, when the conductor in the third hole 152 and the opening 146 is made of aluminum (Al), the second barrier layer 160 is made of, for example, titanium nitride (TiN), titanium (Ti)/TiN, Ti, other transition metal based materials, or combinations thereof. The second barrier layer 160 is formed by, for example, physical vapor deposition (PVD), ionized physical vapor deposition (IPVD), atomic layer deposition (ALD), chemical vapor deposition (CVD), or combinations thereof.

Figure 12:
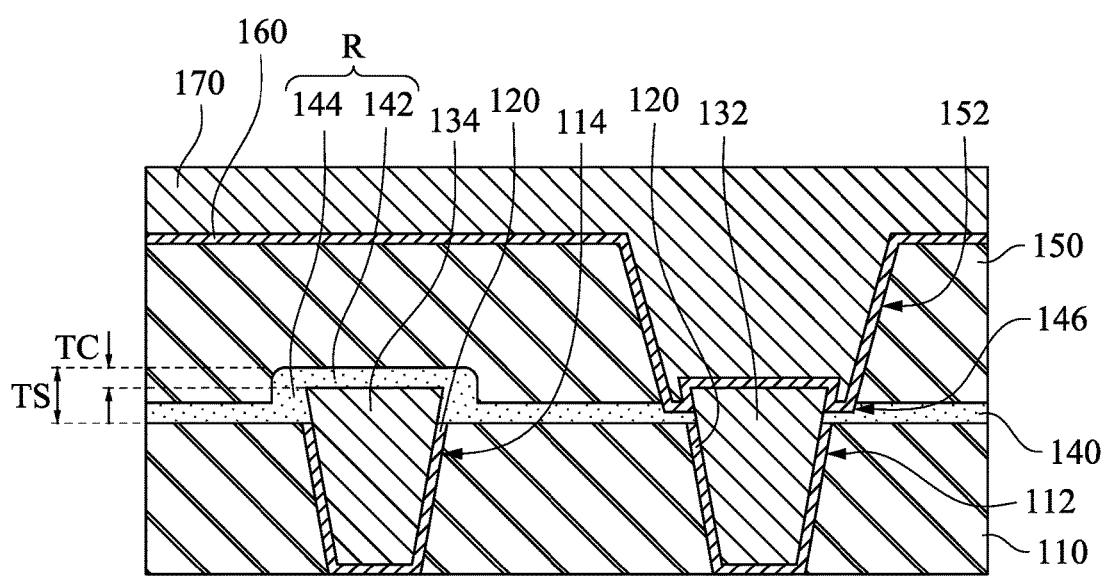

Reference is made to FIG. 12. A second electrically conductive material 170 overfills the third hole 152 and the opening 146. The second electrically conductive material 170 is made of metal, such as copper (Cu), aluminum (Al), tungsten (W), nickel (Ni), cobalt (Co), titanium (Ti), platinum (Pt), tantalum (Ta), or combinations thereof. The second electrically conductive material 170 is form by, for example, electrochemical deposition, physical vapor deposition (PVD), chemical vapor deposition (CVD), or combinations thereof.

Figure 13:
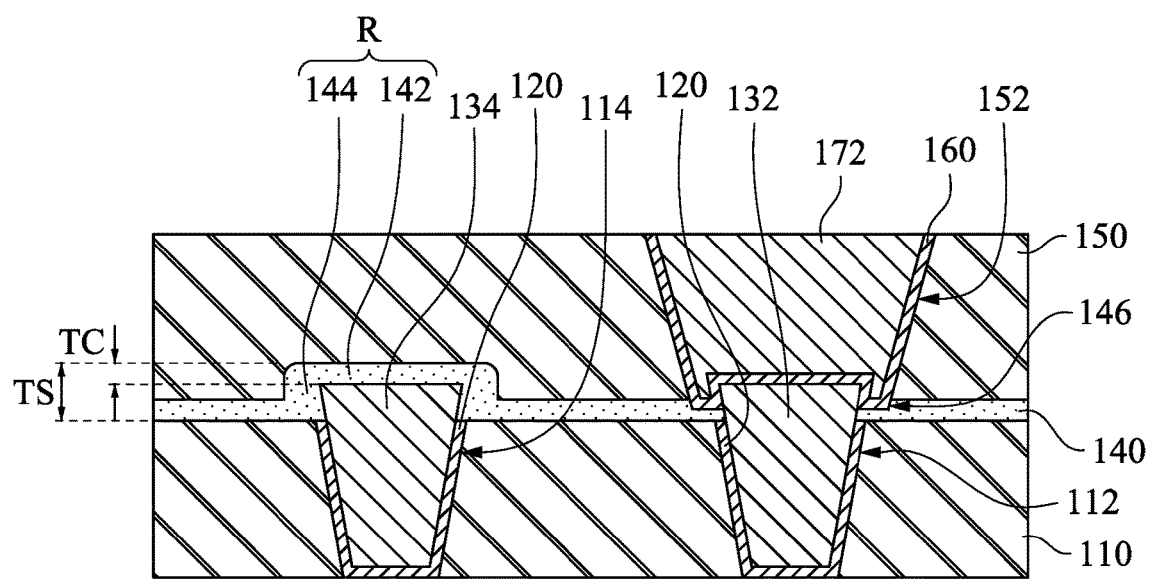

Reference is made to FIG. 13. The excess second electrically conductive material 170 and second barrier layer 160 outside of the third hole 152 and the opening 146 are removed through a removal process. In some embodiments, the second electrically conductive material 170 and second barrier layer 160 over burden are removed by a chemical mechanical polishing (CMP) process. In some embodiments, when the second electrically conductive material 170 is made of copper (Cu), the CMP slurry is made of, for example, a mixture of suspended abrasive particles, an oxidizer, and a corrosion inhibitor, and the CMP slurry is acidic. A two-step CMP process may be used to remove the excess second electrically conductive material 170 and second barrier layer 160. In the first step, the abrasive will remove the bulk second electrically conductive material 170 without disturbing the second barrier layer 160. In the second step, the residual second electrically conductive material 170 and the second barrier layer 160 will be removed using silica abrasive. After the CMP process, a top conductor 172 is formed in the third hole 152 and the opening 146, and the top conductor 172 is electrically connected to the first bottom conductor 132.

In some embodiments, the first and second dielectric layers 110 and 150 may be made of substantially the same material, and thus the etching selectivity between the first and second dielectric layers 110 and 150 is low. In such embodiments, if the etch stop layer 140 were not formed between the first and second dielectric layers 110 and 150, the etching of the second dielectric layer 150 might overetch the first dielectric layer 110 to from at least one recess in the first dielectric layer 110 with a high aspect ratio. Since the aspect ratio of the recess is high, the second barrier layer 160 may not be formed in the recess with acceptable step coverage. Therefore, a pullback void may be formed between the top conductor 172 and the first bottom conductor 132 due to a following thermal process, such as baking.

In order to prevent the first dielectric layer 110 from being overetched, the etch stop layer 140 is formed between the first and second dielectric layers 110 and 150. The etch stop layer 140 has high etch resistance to the etching of the second dielectric layer 150. Therefore, the etching of the second dielectric layer 150 can be stopped by the etch stop layer 140 without overetching the first dielectric layer 110. Since the first dielectric layer 110 is not overetched to form the high aspect ratio recess, the second barrier layer 160 can be formed with at least acceptable step coverage to adhere the top conductor 172 to the second dielectric layer 150 and the etch stop layer 140. Accordingly, a pullback void will not be formed between the top conductor 172 and the first bottom conductor 132 after a following thermal process, such as baking.

According to some embodiments, an interconnection structure includes a first dielectric layer, a first conductor, an etch stop layer, and a second dielectric layer. The first conductor is partially in the first dielectric layer and having a portion protruding from the first dielectric layer. The etch stop layer is on the first dielectric layer and covering the protruding portion of the first conductor. The second dielectric layer is on the etch stop layer. A bottom surface of the second dielectric layer has a portion in a position lower than a top of the first conductor.

In some embodiments, the interconnection structure further includes a second conductor and a third conductor. The second conductor is at least partially in the first dielectric layer. The third conductor is in the second dielectric layer and electrically connected to the second conductor.

In some embodiments, the interconnection structure further includes a barrier layer between the etch stop layer and the third conductor.

In some embodiments, the second conductor has a portion protruding from the first dielectric layer.

In some embodiments, the interconnection structure further includes a barrier layer over a sidewall of the protruding portion of the second conductor.

In some embodiments, the etch stop layer has a raised portion covering the protruding portion of the first conductor.

In some embodiments, the raised portion has a cap part over a top surface of the protruding portion of the first conductor and a spacer part over a sidewall of the protruding portion of the first conductor, and the spacer part is thicker than the cap part.

According to some embodiments, an interconnection structure includes a first dielectric layer, a first conductor, an etch stop layer, a second dielectric layer, and a second conductor. The first conductor is at least partially in the first dielectric layer. The etch stop layer is on the first dielectric layer. The second dielectric layer is on the etch stop layer. An interface between the etch stop layer and the second dielectric layer has a first portion in a first position lower than a top of the first conductor and a second portion in a second position higher than the top of the first conductor. The second conductor is in the second dielectric layer and the etch stop layer and electrically connected to the first conductor.

In some embodiments, the second conductor tapers toward the first conductor.

In some embodiments, the etch stop layer has a portion surrounding the first conductor, and said portion of the etch stop layer has a top surface in a third position lower than the first position.

In some embodiments, the interconnection structure further includes a barrier layer contacting said portion of the etch stop layer.

In some embodiments, the interconnection structure further includes a third conductor at least partially in the first dielectric layer, wherein the etch stop layer covers the third conductor.

In some embodiments, the third conductor has a portion protruding from the first dielectric layer.

In some embodiments, the etch stop layer has a raised portion conformally over the protruding portion of the third conductor.

According to some embodiments, a method for manufacturing an interconnection structure, the method comprising: etching a first hole in a first dielectric layer; depositing a first conductor in the first hole; etching back the first dielectric layer, such that the first conductor has a portion protruding from the first dielectric layer; conformally depositing an etch stop layer on the first dielectric layer and the protruding portion of the first conductor; and depositing a second dielectric layer on the etch stop layer.

In some embodiments, the method further includes etching a second hole in the first dielectric layer; depositing a second conductor in the second hole, wherein conformally depositing the etch stop layer comprises conformally depositing a portion of the etch stop layer over the second conductor; etching a third hole in the second dielectric layer and the etch stop layer to expose the second conductor, wherein the protruding portion of the first conductor is covered by the etch stop layer after etching the third hole; and depositing a third conductor in the third hole.

In some embodiments, etching the third hole is performed such that the third hole tapers toward the second conductor.

In some embodiments, conformally depositing the etch stop layer is performed such that the etch stop layer has a raised portion covering the protruding portion of the first conductor.

In some embodiments, the method further includes etching a second hole in the second dielectric layer and the etch stop layer to expose the first conductor; and depositing a second conductor in the second hole.

In some embodiments, etching the second hole includes etching the etch stop layer to form a recess surrounding the first conductor. The method further includes depositing a barrier layer to line the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure, comprising:
   a first dielectric layer;
   a first conductor partially in the first dielectric layer and having a portion protruding from the first dielectric layer;
   an etch stop layer on the first dielectric layer and has a raised portion covering the protruding portion of the first conductor, wherein the raised portion has a cap part over a top surface of the protruding portion of the first conductor and a spacer part over a sidewall of the protruding portion of the first conductor and thicker than the cap part; and
   a second dielectric layer on the etch stop layer.

2. The interconnection structure of claim 1, further comprising:
   a second conductor at least partially in the first dielectric layer; and
   a third conductor in the second dielectric layer and electrically connected to the second conductor.

3. The interconnection structure of claim 2, further comprising:
   a barrier layer between the etch stop layer and the third conductor.

4. The interconnection structure of claim 2, wherein the second conductor has a portion protruding from the first dielectric layer.

5. The interconnection structure of claim 4, further comprising:
   a barrier layer over a sidewall of the protruding portion of the second conductor.

6. The interconnection structure of claim 1, wherein a bottom surface of the second dielectric layer is lower than a top surface of the first conductor.

7. The interconnection structure of claim 2, wherein the third conductor tapers toward the second conductor and is on opposite sidewalls of the second conductor.

8. An interconnection structure, comprising:
   a first dielectric layer;
   a first conductor at least partially in the first dielectric layer;
   an etch stop layer on the first dielectric layer;
   a second dielectric layer on the etch stop layer, wherein an interface between the etch stop layer and the second dielectric layer has a first portion in a first position lower than a top of the first conductor and a second portion in a second position higher than the top of the first conductor; and
   a second conductor in the second dielectric layer and electrically connected to the first conductor, wherein the second conductor has an extending portion that extends through the first portion of the interface between the etch stop layer and the second dielectric layer and the extending portion of the second conductor is on opposite sidewalls of the first conductor.

9. The interconnection structure of claim 8, wherein the second conductor tapers toward the first conductor.

10. The interconnection structure of claim 8, wherein the etch stop layer has a portion surrounding the first conductor, and said portion of the etch stop layer has a top surface in a third position lower than the first position.

11. The interconnection structure of claim 10, further comprising:
    a barrier layer contacting said portion of the etch stop layer.

12. The interconnection structure of claim 8, further comprising:
    a third conductor at least partially in the first dielectric layer, wherein the etch stop layer covers the third conductor.

13. The interconnection structure of claim 12, wherein the third conductor has a portion protruding from the first dielectric layer.

14. The interconnection structure of claim 13, wherein the etch stop layer has a raised portion conformally over the protruding portion of the third conductor.

15. The interconnection structure of claim 8, wherein the etch stop layer has a raised portion covering a protruding portion of the first conductor and the raised portion has a cap part over a top surface of the protruding portion of the first conductor and a spacer part over a sidewall of the protruding portion of the first conductor and thicker than the cap part.

16. A method for manufacturing an interconnection structure, the method comprising:
    etching a first hole in a first dielectric layer;
    depositing a first conductor in the first hole;
    etching back the first dielectric layer, such that the first conductor has a portion protruding from the first dielectric layer;
    conformally depositing an etch stop layer on the first dielectric layer and the protruding portion of the first conductor;
    depositing a second dielectric layer on the etch stop layer;
    etching a second hole in the second dielectric layer and the etch stop layer to expose the first conductor and to form a recess surrounding the first conductor; and
    depositing a barrier layer to line the recess.

17. The method of claim 16, further comprising:
    etching a second hole in the first dielectric layer;
    depositing a second conductor in the second hole in the first dielectric layer, wherein conformally depositing the etch stop layer comprises conformally depositing a portion of the etch stop layer over the second conductor;
    etching a third hole in the second dielectric layer and the etch stop layer to expose the second conductor, wherein the protruding portion of the first conductor is covered by the etch stop layer after etching the third hole; and
    depositing a third conductor in the third hole.

18. The method of claim 17, wherein etching the third hole is performed such that the third hole tapers toward the second conductor.

19. The method of claim 16, wherein conformally depositing the etch stop layer is performed such that the etch stop layer has a raised portion covering the protruding portion of the first conductor.

20. The method of claim 16, further comprising depositing a second conductor in the second hole.

* * * * *